United States Patent [19]

Decke et al.

[11] Patent Number: 5,221,901

[45] Date of Patent: Jun. 22, 1993

[54] DOUBLE SURFACE COIL FOR A NUCLEAR MAGNETIC RESONANCE APPARATUS

[75] Inventors: Guenther Decke, Hemhofen; Hermann Requardt, Erlangen, both of Fed. Rep. of Germany

[73] Assignee: Siemens Aktiengesellschaft, Munich, Fed. Rep. of Germany

[21] Appl. No.: 763,639

[22] Filed: Sep. 23, 1991

[30] Foreign Application Priority Data

Sep. 29, 1990 [DE] Fed. Rep. of Germany ....... 4030878

[51] Int. Cl.⁵ .............................................. G01V 3/00
[52] U.S. Cl. .................................. 324/318; 324/322; 128/653.5
[58] Field of Search ............... 324/300, 307, 309, 318, 324/319, 322; 128/653.5

[56] References Cited

U.S. PATENT DOCUMENTS

| | | | |
|---|---|---|---|
| 3,956,751 | 5/1976 | Herman | 343/744 |
| 4,642,569 | 2/1987 | Hayes et al. | 324/318 |
| 4,701,732 | 10/1987 | Nestlerode | 334/56 |
| 4,733,190 | 4/1988 | Dembinski | 324/318 |
| 4,782,298 | 11/1988 | Arakawa et al. | 324/322 |
| 4,825,164 | 4/1989 | Requardt | 324/322 |
| 4,833,409 | 5/1989 | Eash | 324/322 |
| 4,855,680 | 8/1989 | Arakawa et al. | 324/322 |
| 4,881,034 | 11/1989 | Kaufman et al. | 324/318 |
| 4,906,933 | 4/1990 | Keren | 324/318 |
| 4,924,868 | 5/1990 | Krause et al. | 128/653 SC |

FOREIGN PATENT DOCUMENTS

| | | |
|---|---|---|
| 0148566 | 7/1985 | European Pat. Off. . |
| 0196134 | 10/1986 | European Pat. Off. . |
| 0276508 | 8/1988 | European Pat. Off. . |
| 0335512 | 10/1989 | European Pat. Off. . |
| 3500456 | 7/1985 | Fed. Rep. of Germany . |
| 3820168 | 12/1989 | Fed. Rep. of Germany . |
| 3905564 | 9/1990 | Fed. Rep. of Germany . |

OTHER PUBLICATIONS

"Hochfrequenzsysteme für die Kernspintomographie," Dürr et al., ntzArchive, vol. 11, No. 5, 1989, pp. 237-243.

"Hochfrequenzantennen für die Kernspintomographie," Krause, ITG-Fachberichete 99, Antennen, Presentation at the ITG Factagung, Mar. 24-27, 1987, pp. 1-5.

Patents Abstracts of Japan, E-583, Feb. 18, 1988, vol. 12/No. 54, Application No. 61-42938.

*Primary Examiner*—Louis Arana
*Attorney, Agent, or Firm*—Hill, Steadman & Simpson

[57] ABSTRACT

A double surface coil for a nuclear magnetic resonance apparatus as two individual coils, each individual coils being formed by two sub-coils connected in parallel. A series circuit of a capacitor and an inductor is connected in each sub-coil, with a series circuit of a capacitor and a controllable switch being connected in parallel with each inductor. By appropriate drive of switches, both individual coils, one individual coil by itself, or both individual coils in alternating operation can be activated.

2 Claims, 2 Drawing Sheets

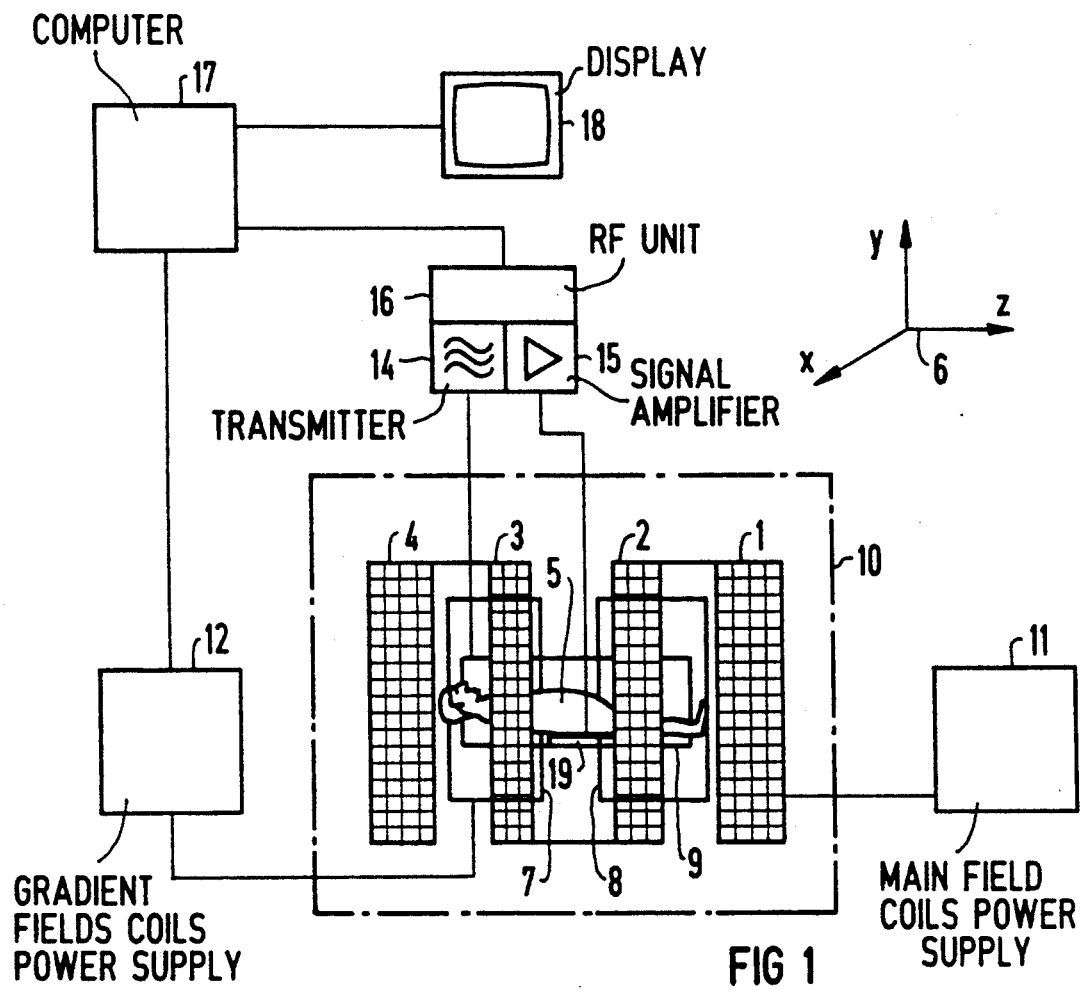
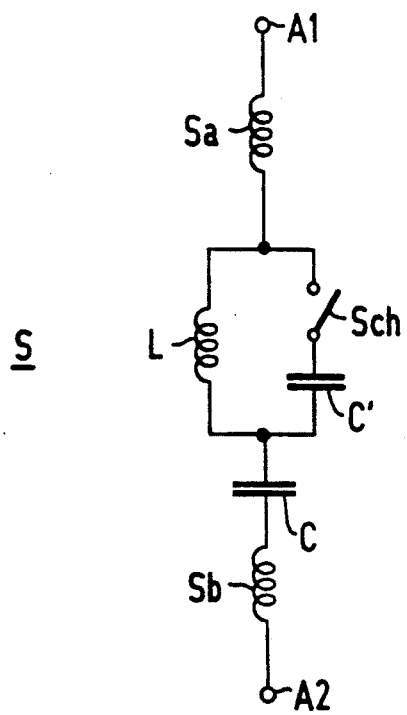

5,221,901

DOUBLE SURFACE COIL FOR A NUCLEAR MAGNETIC RESONANCE APPARATUS

BACKGROUND OF THE INVENTION

1. Field of the Invention

The present invention is directed to a double surface coil for a nuclear magnetic resonance apparatus of the type having two individual coils each consisting of two sub-coils connected in parallel.

2. Description of the Prior Art

The use of surface coils is useful in a nuclear magnetic resonance apparatus for generating a tomogram (magnetic resonance imaging, or MRI) as well as for conducting spectroscopic examinations. Double surface coils of the type having two individual coils, each consisting of two sub-coils, are known in the art and are particularly suitable for obtaining a mammogram.

The use of such surface coils is particularly advantageous if certain parts of the examination subject are to be interpreted with an improved signal-to-noise ratio. Transmission is usually undertaken with a whole-body antenna, and reception is undertaken with the surface coil. When transmitting using the whole-body antenna, the surface coil must be decoupled from the system so that it does not result in topical elevations of the field in the resonant condition, and thus to a local heating of the examination subject. Given surface coils which are composed of a plurality of individual coils, any individual coil which is not active during the reception mode must be decoupled during the reception mode so that the signal-to-noise ratio is not degraded. A surface coil is disclosed in European Application 0 280 908 wherein switches are provided for this purpose, the switches being in the form, for example, of PIN diode switch which disconnect the sub-coils which are not required for a particular use.

Decoupling of a whole-body antenna using a quarter-wave cable is disclosed in European Application 0 262 495. The quarter-wave cable is connected to the surface coil. The end of the quarter-wave cable is shorted when emitting high-frequency pulses via the whole-body antenna, and is opened when receiving nuclear magnetic resonance signals with the surface coil. The whole-body antenna is thus decoupled while the surface coil is receiving.

SUMMARY OF THE INVENTION

It an object of the present invention to provide an arrangement for decoupling a double surface coil of the type having two individual coils each consisting of two sub-coils connected in parallel, with a low control outlay.

The object is achieved in accordance with the principles of the present invention in a double surface sub-coil of the type having two individual coils, each consisting of two sub-coils connected in parallel, wherein a series circuit of a capacitor and an inductor is connected in each sub-coil, and further wherein a series circuit of a capacitor and a controllable switch is connected in parallel with each inductor.

In a preferred embodiment, each controllable switch is formed by a PIN diode, and all of the sub-coils are connected together at a common junction. It is also preferable that the sub-coils comprising an individual coil be connected together by a connecting inductor, the inductor being connected between the respective junctions in the two sub-coils between the PIN diode and the capacitor in the aforementioned series circuit. Each individual coil has a control signal input by means of which a control voltage can be connected across both sub-coils in that individual coil. The control voltage has a control current associated therewith, which proceeds via a control current path formed by a part of the winding of a first sub-coil in the individual coil, the inductor of the first sub-coil, the PIN diode of the first sub-coil, the connecting inductor, the PIN diode of the second sub-coil of the individual coil, the inductor of the second sub-coil, and a part of the winding of the second sub-coil. With little control outlay, it is thus possible to operate the two individual coils separately, or in common.

DESCRIPTION OF THE DRAWINGS

FIG. 1 is a schematic block diagram of a typical magnetic resonance imaging apparatus of the type in which the double surface coil constructed in accordance with the principles of the present invention can be employed.

FIG. 2 is a schematic circuit diagram of circuitry usable in a double surface coil constructed in accordance with the principles of the present invention, for interrupting an individual coil using a resonant circuit.

DESCRIPTION OF THE PREFERRED EMBODIMENTS

Figure 3:
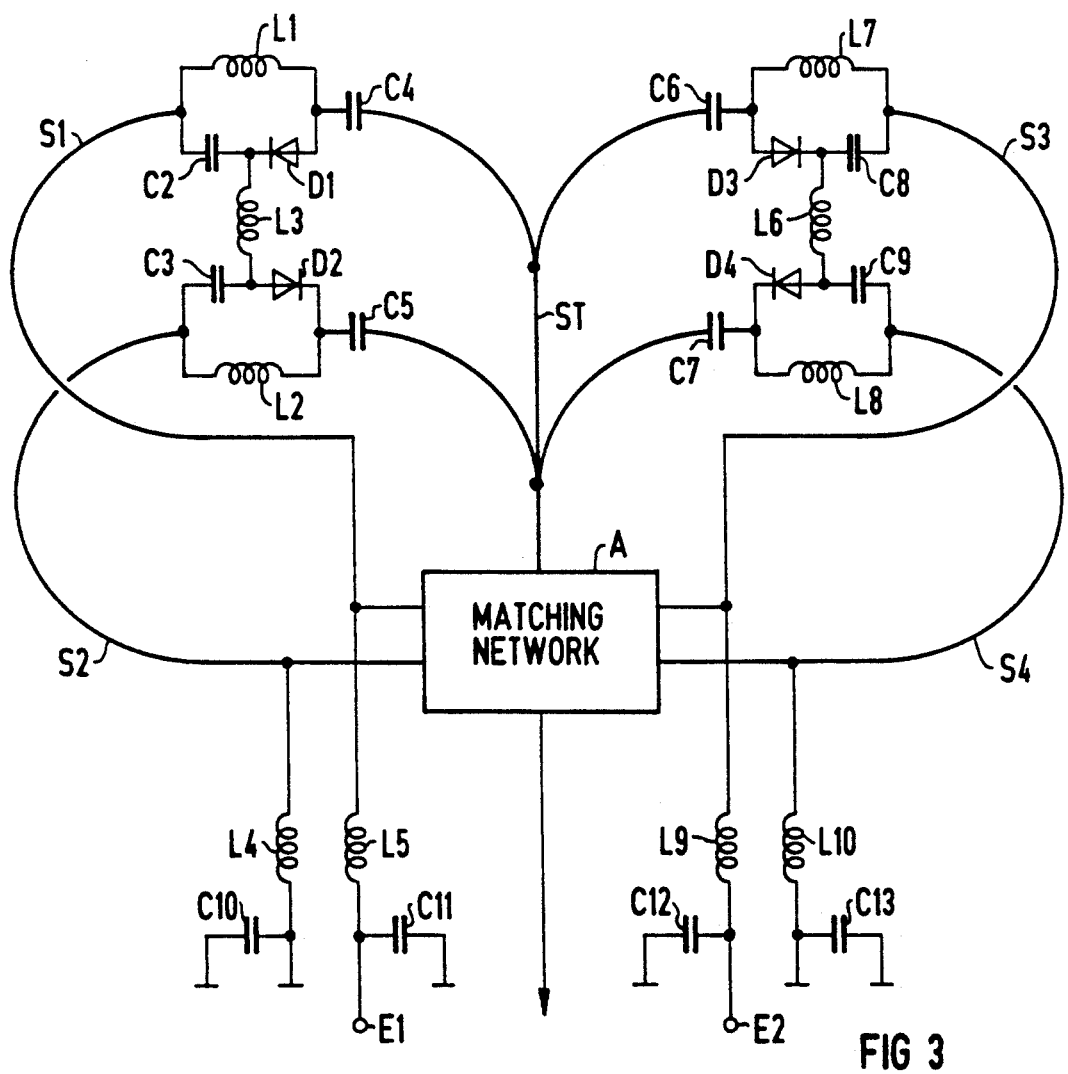
FIG. 3 is a schematic circuit diagram of a complete double surface coil constructed in accordance with the principles of the present invention, in an exemplary embodiment.

The basic structure of a nuclear magnetic resonance apparatus, of the type used for obtaining an image or spectral information from an examination subject, is shown in FIG. 1. In the apparatus, coils 1, 2, 3 and 4 generate a main magnetic field wherein the body 5 of a patient to be examined is situated, given a medical application. The apparatus also includes gradient coils which are provided for generating independent, orthogonal magnetic field gradients in the x, y and z-directions of a rectangular coordinate system 6. For clarity, only the gradient coils 7 and 8 are shown in FIG. 1, which generate a field gradient in the x-direction in combination with a pair of identical gradient coils (not shown) disposed on the opposite side of the body 5. Similar pairs of gradient coils (not shown) are provided for generating a gradient in the y-direction, those coils being disposed parallel to, above and below, the body 5. A third pair of gradient coils (not shown) for generating a gradient field in the z-direction are disposed transversely relative to the longitudinal axis of the body 5, at the feet and head thereof. The apparatus also includes a whole-body resonator 9, functioning as an antenna for generating the nuclear magnetic resonance signals. A surface coil 19 is provided for picking up the nuclear magnetic resonance signals. The surface coil 19 may also serve to generate the nuclear magnetic resonance signals, instead of using the whole-body resonator 9.

The actual examination instrument is composed of the coils 1, 2, 3, 4, 7 and 8 surrounded by a dot-dashed line 10, as well as the whole-body resonator 9 and the surface coil 19. A main field coils power supply 11 is provided for operating the coils 1 through 4. The gradient coils 7 and 8, as well as the further gradient coils which are not shown in FIG. 1, are connected to a gradient fields coils power supply 12. A radio frequency transmitter 14 controlled by a process control computer 17 is connected to the whole-body resonator 9. The surface coil 19 is also connected to the computer 17, through a signal amplifier 15. The components 14 and 15 form a radio frequency transmission/reception unit 16. The computer 17 is also connected to the gradient fields coils power supply 12, and operates in a known manner to cause the generation of signals which are used to construct an image, or a representation of spectroscopic data, which is portrayed on a display 18 connected to the computer 17.

The principle of decoupling or interrupting a radio frequency coil with the assistance of a resonant circuit, in accordance with the principles of the present invention, is described in general terms with reference to FIG. 2. A series resonant circuit having an inductor L and a first capacitor C is connected in a coil S having terminals A1 and A2. This series resonant circuit thus divides the coil S into two sub-coils Sa and Sb. A series circuit consisting of a switch Sch and of a second capacitor C' is connected in parallel with the inductor L. The inductor and the capacitors C, C' are dimensioned such that the inductor L in combination with the first capacitor forms a series resonant circuit, and the inductor L in combination with the second capacitor C' forms a parallel resonant circuit, at the operating frequency of the coil S.

When the switch Sch is opened in this arrangement, a series resonant circuit is formed in series with the coil S. The series resonant circuit, in resonance, has a low impedance, so that a signal induced in the coil S is present substantially unattenuated at the outputs A1 and A2. If, by contrast, the switch Sch is closed, a parallel resonant circuit is created in series with the coil S, the parallel resonant circuit, in resonance, forming a high impedance. The coil S is thus interrupted by the presence of this high-impedance circuit.

A double surface coil is shown in FIG. 3 in an exemplary embodiment employing decoupling circuitry of the type shown in FIG. 2. The double surface coil has a first individual coil formed by first and second sub-coils S1 and S2, and a second individual coil formed by first and second sub-coils S3 and S4. The sub-coils S1 and S2 are connected in parallel, and the sub-coils S3 and S4 are also connected in parallel. In the exemplary embodiment of FIG. 3, each of the sub-coils S1 through S4 is formed by a single turn, so that each individual coil is formed by two turns connected in parallel. All of the sub-coils S1 through S4 are connected at common junction, formed by a connecting branch or web St. The connecting web St, as well as those ends of the sub-coils S1 through S4 facing away from the connecting web St, are connected to a matching network A which balances the double surface coil as well as performing the function of impedance matching of the double surface coil to the RF unit 16. From the matching network A, the nuclear magnetic resonance signal picked up by the double surface coil is supplied to the transmission/reception unit 16 via the signal amplifier shown in FIG. 1.

The circuit shown in FIG. 2 is connected in each sub-coil S1 through S4. The switch Sch according to FIG. 2 is formed by a PIN diode, the PIN diodes being referenced D1, D2, D3 and D4. The junction between the PIN diode D1 and the capacitor C2 in the sub-coil S1 is connected via an inductor L3 to the junction of the capacitor C3 and the PIN diode D2 in the sub-coils S2. Similarly, the junction of the PIN diode D3 with the capacitor C8 in the sub-coil S3 is connected via an inductor L6 to the junction of the PIN diode D4 with the capacitor C9 in the sub-coil S4. A first control signal is supplied to the sub-coil S1 via an input E1 and an inductor L5. The first control signal has a reference potential associated therewith, and the sub-coil S2 is connected to this reference potential via an inductor L4. A second control signal is connectable to the sub-coil S3 in the same way via an inductor L9. The reference potential of the second control signal is connected to the sub-coil S3 via an inductor L10. Connection of the control signals preferably takes place within the matching network A, since terminals will already be provided at that location.

Two control signals Sia and Sib are required for driving the four sub-coils. The two control signals Sia and Sib are respectively shown in FIGS. 4 and 5.

Figure 4:
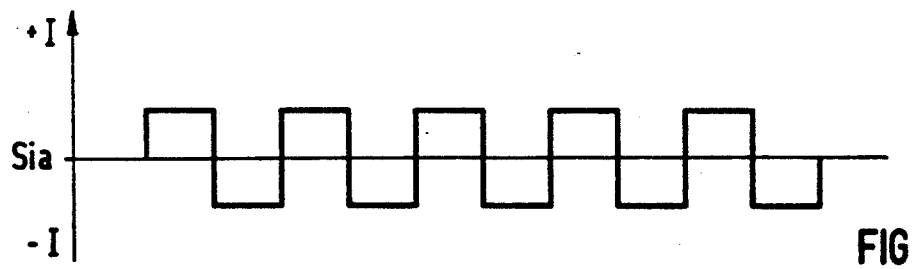
FIG. 4 is a graph showing a dynamic control signal for use with the embodiment shown in FIG. 3.

The control signal Sia of FIG. 4 is dynamic (i.e., time varying). The control signal Sia follows the timing of the clock for the excitition sequence for exciting the nuclear magnetic resonance signals, and alternates between a current $+I$ in the conducting direction which switches a PIN diodes charged with that current to a transmitting state, and a current $-I$ (or a lack of current) associated with a voltage in the non-conducting direction, which switches a PIN diode into the inhibited condition.

Figure 5:
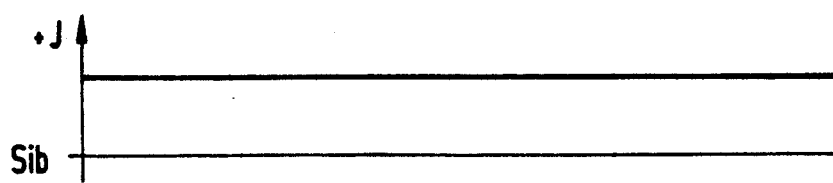
FIG. 5 is a graph of a static control signal for use with the embodiment shown in FIG. 3.

The control signal Sib of FIG. 5 is static, and is formed by a constant current in the conducting direction of the PIN diodes, which switches the PIN diodes charged with this signal to the transmitting state.

If, for example, the left individual coil in FIG. 3, formed by sub-coils S1 and S2, is to be operated (activated), the dynamic control signal Sia is applied to the control signal input E1, and the static control signal Sib is applied to the control signal input E2.

The control signal Sib causes current to flow via the inductor L9, a part of the winding of the sub-coil S3, the inductor L7, the PIN diode D3, the inductor L6, the PIN diode D4, the inductor L8, a part of the winding of the sub-coil S4, and the inductor L10 to ground. Parallel resonant circuits having a high impedance are thereby formed in each of the sub-coils S3 and S4, thereby interrupting the sub-coils S3 and S4.

The control signal Sia is applied to the left individual coil of FIG. 3. The resonant circuits in the sub-coils S1 and S2 are thus alternately switched as series or parallel resonant circuits, as described in connection with FIG. 2. The sub-coils S1 and S2 are thus activated and interrupted in alternation. This takes place synchronously with the excitation of the nuclear magnetic resonance signals, in such a fashion that the sub-coils S1 and S2 are interrupted during the transmission phase of the whole-body antenna, and are thus decoupled, and are activated during the reception phase.

Given the opposite application of the drive signals Sia and Sib to the inputs E1 and E2, it is possible to interrupt the left individual coil and to drive the right individual coil, i.e., the sub-coils S3 and S4 in alternation.

If all the sub-coils S1 through S4 are to be driven simultaneously, the dynamic signal Sib is applied to both inputs E1 and E2. All of the sub-coils S1 through S4 will thus be activated during the reception phase, and will be decoupled during the transmission phase of the whole-body antenna.

With the illustrated arrangement, therefore, both individual coils, or a selected individual coil, can be activated, with the other individual coil being decoupled. Dynamic switching between the two individual coils can also be undertaken, so that slices from the left and right region of the double surface coil can be registered in alternation.

Only two control signals Sia and Sib, only one of which must be dynamic, are thus required for all desired operating modes.

The illustrated double surface coil is particularly suited for mammography.

Although modifications and changes may be suggested by those skilled in the art, it is the intention of the inventors to embody within the patent warranted hereon all changes and modifications as reasonably and properly come within the scope of their contribution to the art.

We claim as our invention:

1. A double surface coil for a nuclear magnetic resonance apparatus, said double surface coil comprising:
    first and second individual coils, each individual coil consisting of first and second sub-coils connected in parallel; and
    each sub-coil including a capacitor and an inductor connected at a node in said sub-coil and a branch connected in parallel with said inductor in said sub-coil, said branch consisting of a branch capacitor and a controllable switch connected in series.

2. A double surface coil as claimed in claim 1 wherein each controllable switch is formed by a PIN diode, wherein all of said sub-coils are connected together at a common junction, wherein said series circuit capacitor and said controllable switch in each series branch are connected together at a series branch junction, said double surface coil further comprising two connecting inductors respectively connected between said first and second sub-coils in each of said first and second individual coils, said connecting inductor being connected between the respective series branch junctions of said first and second sub-coils, terminal means for applying a control signal having a control voltage and a control current associated therewith across each of said first and second sub-coils in each of said first and second individual coils, and said PIN diodes in each of said first and second sub-Ocoils being polarized to form a current path for said control current including a part of a winding of said first sub-coil, said inductor of said first sub-coil, said PIN diode in said series branch of said first sub-coil, said connecting inductor between said first and second sub-coils, said PIN diode in the series branch of said second sub-coil, said inductor of said second sub-coil, and a part of a winding of said second sub-coil.

* * * * *